(12) United States Patent
Ruedinger

(10) Patent No.: US 7,464,017 B2
(45) Date of Patent: Dec. 9, 2008

(54) TIME MULTIPLEXED INTERFACE FOR EMULATOR SYSTEM

(75) Inventor: Jeffrey Joseph Ruedinger, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 617 days.

(21) Appl. No.: 11/035,552

(22) Filed: Jan. 14, 2005

(65) Prior Publication Data

US 2006/0161418 A1 Jul. 20, 2006

(51) Int. Cl.
*G06F 9/455* (2006.01)

(52) U.S. Cl. ............... 703/23; 703/25; 717/134; 717/135; 717/138

(58) Field of Classification Search .......... 703/25
See application file for complete search history.

(56) References Cited

U.S. PATENT DOCUMENTS 5,574,873 A * 11/1996 Davidian ............ 712/200
5,802,348 A * 9/1998 Stewart et al. ........... 703/25
5,911,059 A * 6/1999 Profit, Jr. .............. 703/23
5,946,472 A    8/1999 Graves et al.
5,963,736 A * 10/1999 Sarno et al. ............ 703/27
6,009,256 A * 12/1999 Tseng et al. ............ 703/13
6,584,436 B2 * 6/2003 Hellestrand et al. ....... 703/13
6,782,355 B1   8/2004 Cook et al.

OTHER PUBLICATIONS

Ruedinger et al, "Achieve Emulator-Based Simulation At In-Circuit Speeds", EDN, 47, No. 5, pp. 107-118, Mar. 7, 2002, obtained from www.ednmag.com.*

* cited by examiner

*Primary Examiner*—Paul L Rodriguez
*Assistant Examiner*—Mary C Jacob
(74) *Attorney, Agent, or Firm*—Wood, Herron & Evans, LLP

(57) ABSTRACT

A method for emulating a hardware design by time division multiplexing data communicated between an emulator and a runtime assist unit (RTAU), such as a behavior card. Data from the emulator may be received directly at the general purpose registers of the RTAU. A programmable delay may be used in conjunction with a step generator to initiate concurrent cycle processes. Code executed by the RTAU may be coded in assembly, and external interrupts that might otherwise affect the determined processing time of the RTAU task are disabled. The time multiplexing reduces card port, cabling and processing cycle requirements.

7 Claims, 2 Drawing Sheets

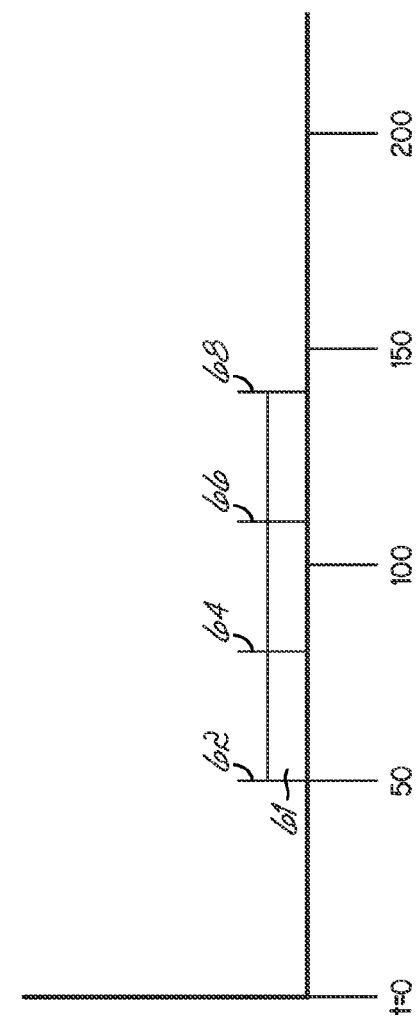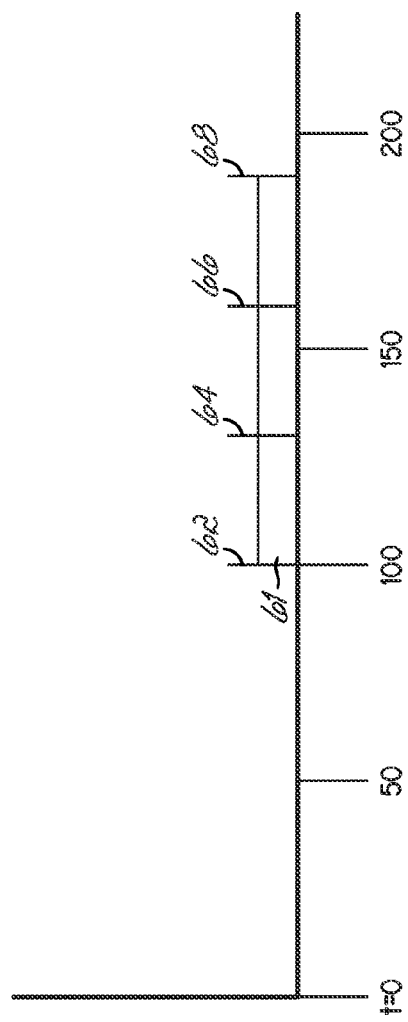

TIME MULTIPLEXED INTERFACE FOR EMULATOR SYSTEM

FIELD OF THE INVENTION

The present invention relates generally to electronic systems simulation and, more specifically, to hardware simulators and emulators.

BACKGROUND OF THE INVENTION

Electronics designers commonly rely on simulators and emulators to test their designs for both operability and compatibility with existing systems or interfacing components. A simulator typically comprises a general purpose computer workstation that runs a simulation program. The program uses software to simulate, or model, the circuits of the design to be evaluated. The program thus simulates input signals and outputs data representative of signals produced by the circuits in response to the input signals.

Simulators by themselves, however, have been found to be relatively inefficient and lacking in processor speed, particularly for large and complex designs, and can require prohibitively long periods of time to complete a simulation. To help alleviate these limitations, accelerator hardware can be interfaced with a workstation. An accelerator is typically an electronic circuit board system that performs the concurrent processing, or operations that model circuit logic. The workstation can then concentrate the majority of its available processing power on sequential operations, i.e., operations that apply test vector data and otherwise simulate sequentially occurring activities with respect to a simulation.

A further improvement in processing efficiency can be gained by providing an emulator, or an emulator/accelerator combination. An emulator is a large scale hardware configuration typically implemented in field programmable gate arrays (FPGAs) or some other type of software configurable custom hardware. Because the logic is modeled in hardware (e.g., FPGAs) that approaches the same degree of parallel operation that the actual circuit being modeled would exhibit, the emulator/accelerator can perform the concurrent operations much faster than an accelerator alone.

Emulator are capable of emulating many types of computer system hardware and other logic, including, for example, memory devices. One emulator type, for example, executes a logic model embodied in suitable software that reflects a combination of a user model logic portion and non-user-model logic portion. The user model logic portion may be derived from (e.g., compiling) a netlist for the hardware design under test. Accordingly, this portion represents the functionality of the hardware design. The non-user-model logic portion is peripheral to the hardware design itself and is included for the purpose of providing peripheral functions to the emulation, such as high-speed multiplexed data communication between the emulator/accelerator and a host workstation.

The chief advantage of including an emulator is that it can perform the concurrent operations in parallel with the sequential operations performed by the workstation to which it is connected. In some cases, an emulator can be interfaced to target hardware. Such hardware may comprise a portion of the system that is being tested or otherwise evaluated. For example, the target hardware may be a personal computer in which a microprocessor has been removed and replaced with cables connecting it to the emulator.

Emulator systems may include one or more behavior cards for performing the sequential operations, thereby taking that portion of the load off the workstation. The behavior card can apply test vectors or model sequential devices, e.g., a memory. Thus, the emulator performs the concurrent operations while the behavior card performs the sequential operations. The two preferably operate in parallel. Nevertheless, the two do not operate asynchronously with respect to each other. Rather, attempts are made to synchronize them with each other by operating in lock-step fashion, i.e., a handshake. On each cycle of the emulation, the emulator produces a "STEP" or "BEGIN_CYCLE" signal. In response to this signal, the behavior card generates a "HALT" signal, which indicates that the behavior card has begun processing data it received from the emulator on the previous cycle and needs the emulator to wait until it has finished doing so. When it has finished, the behavior card drops the HALT signal. In response to the HALT signal being dropped, the emulator can reassert the STEP signal when it is ready to begin another emulation cycle. In addition, if the behavior card asserts the HALT signal but detects an error condition, requires more input data before it can continue, or otherwise needs to suspend the emulation, it can assert a "STOPPED" signal. This signal provides an indication of such a condition to the workstation and to any other behavior cards in the system.

While such timing and hardware implementations have improved the processing times of simulation environments, there remain improvements that can be made to emulation systems. For instance, the communication of bit values between an emulator and a behavior card during a processing cycle conventionally requires a wire to be dedicated to each bit value. The thousands of bit values potentially implicated in an emulation cycle can translate into thousands of wires bundled into hundreds or thousands of cables. These cables, in turn, require a large number of ports to accommodate the cable connections. This multitude of cables and ports can dramatically raise implementation costs, financially burdening developers and dissuading users from realizing the benefits of emulation techniques. There is consequently a need for an improved manner of emulating a hardware design that addresses the above identified problems.

SUMMARY OF THE INVENTION

The invention addresses these and other problems associated with the prior art by providing an apparatus, program product, and method for emulating a hardware design by time division multiplexing emulation data communicated between an emulator and a runtime assist unit (RTAU). Data from the emulator may be received directly at the general purpose registers (GPR's) of the RTAU. This feature reduces delay conventionally associated with retrieving comparable data from data staging registers or buffers prior to communication to the GPR's.

To this end, aspects of the invention provide a relatively precise and simultaneous starting point for both the emulator and RTAU. For instance, a programmable delay may be used in conjunction with a step generator to initiate synchronized cycle processes.

Code executed by the RTAU may be coded in assembly, allowing for a more precise understanding of how long the RTAU requires to complete a task. Moreover, external interrupts that might otherwise affect the determined processing time of the RTAU task are minimized or eliminated. As such, the processing sequence of the RTAU may be predicted for purposes of exchanging bursts of data. This predictive result may be useful for determining cycle allocations for time division multiplexing operations.

Because more emulation data may be communicated over the same connection, fewer ports and cables are required. Features of the present invention thus reduce hardware costs associated with cards and cables, in addition to providing faster processing time that may require less memory.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

FIG. 2 shows a sequence of cycle data suitable for execution by the emulator of FIG. 1.

FIG. 3 shows a sequence of cycle data suitable for execution by the RTAU of FIG. 1.

DETAILED DESCRIPTION

Figure 1:
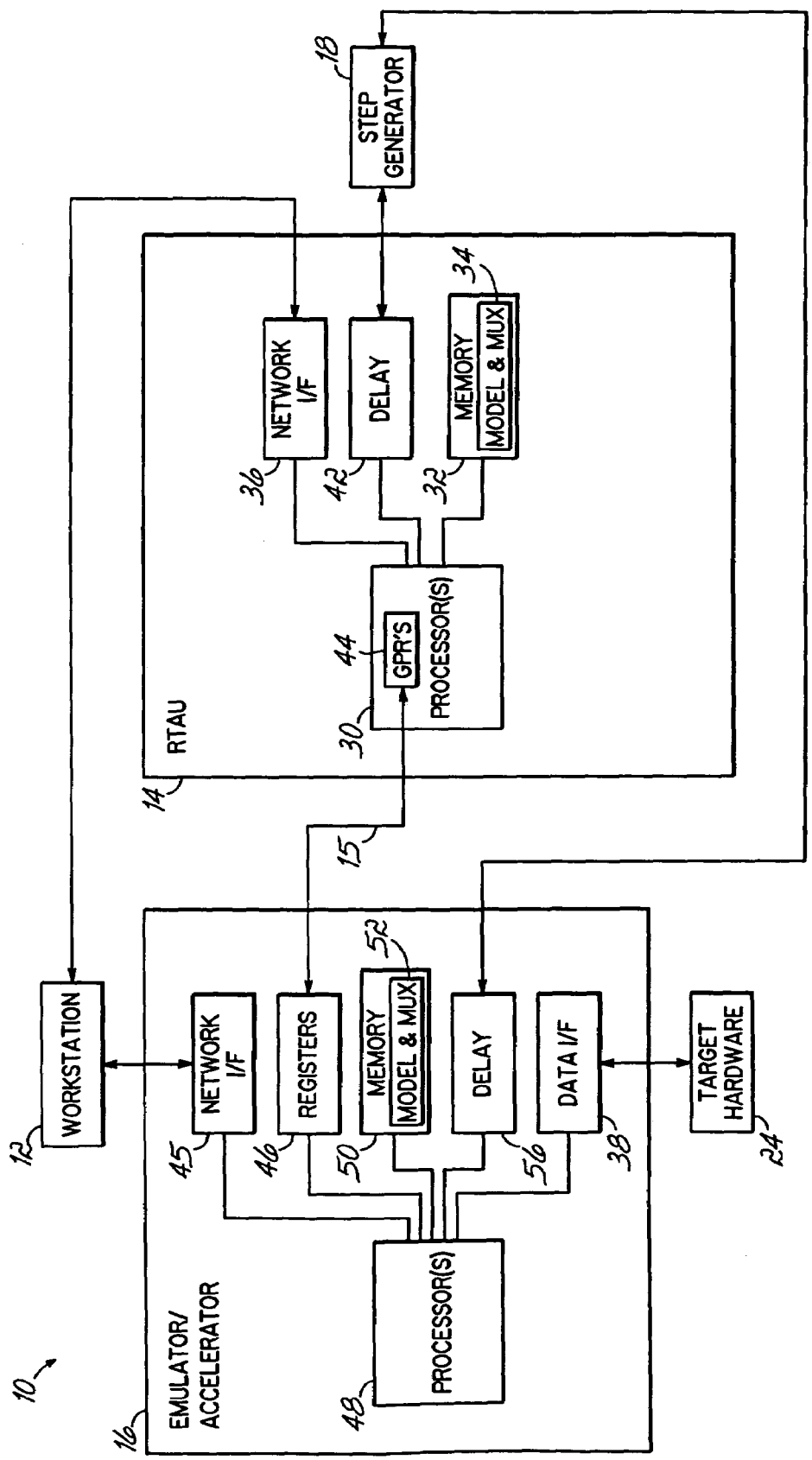
FIG. 1 is a block diagram of an emulator system consistent with the invention.

Turning particularly to the Drawings, wherein like numbers denote like parts throughout the several views, FIG. 1 shows an emulation system 10 configured to time multiplex data over a connection 15 between a RTAU 14 and an emulator 16. As such, emulator data may be communicated directly into GPR's 44 accessible by the processor 30 of the RTAU 14. The emulation system 10 shown in FIG. 1 time division multiplexes the emulation data communicated between an emulator 16 and a microprocessor attachment, such as a behavior card or other RTAU 14. Prior to the present invention, all work using a RTAU has been done using non-multiplexed I/O, or other emulation data. This was because the data exchanged with the emulator needed to be latched at the beginning of the emulation clock cycle and only loose synchronization after that point existed between the microprocessor on the RTAU and the emulator. This allowed a wide variety of microprocessors, running at different speeds and with varying length software to interface with the emulator.

An aspect of the present invention performs a tight skew control on the emulation clock cycle signal, as described in U.S. Pat. Nos. 5,946,472 and 6,782,355, which are both issued to IBM Corporation and are incorporated into this patent specification in their entireties by reference. As such, the emulator 16 may time multiplex data to and from the RTAU processor 30. The step may presume that the processor frequency, interface latency, and instruction set are predetermined and controlled. These features allow reuse of the same physical connections between the emulator 16 and RTAU 14 multiple times within the emulation clock cycle, thus multiplying the number of I/O exchanged between the two devices by the number of time multiplexed cycles without any performance degradation to the system. This has the advantage of decreasing the physical size of the RTAU, as well as reducing the number of cables between it and the emulator box, which translates into significant cost savings.

An aspect of the invention further time multiplexes data directly into the GPR's, rather than into buffers or data staging registers. This feature reduces the latency of accessing the hardware buffers that would detrimentally affect the performance of the system. It achieves this by synchronizing the GPR's load/store instructions in the processor software with the expected time the values are available on the interface cables 15 between the RTAU 14 and the emulator 16.

In the conventional behavior card methodology, a DSTEP is issued from the emulation hardware clock generator to both the emulator 16 and RTAU 14 at the beginning of an emulation cycle. This signal feature, in part, may trigger registers at the interface between the RTAU 14 and emulator 16 to latch and hold new emulator data in both directions throughout the duration of the emulation cycle. The feature further prompts the emulator 16 to begin its sequence of steps to evaluate the hardware model, gate by gate, using a much higher frequency internal evaluation clock. External data from the RTAU 14 is read anytime, since it is stable throughout the entire emulation cycle. The processor 30 on the RTAU 14 is instructed to begin executing its software to process the data received from the emulator 16. Data from the emulator 16 may be loaded into the GPR's 44 at any time. Aspects of the invention thus provide a "virtual I/O" between the RTAU 14 and emulator 16.

The time required for the emulator 16 to evaluate one step is fixed by the internal evaluation clock frequency. Thus, it is very easy to predict and control the time between specific gate evaluations. Likewise, it is easy to predict when I/O signals are read or written, i.e., a signal read or write takes one evaluation clock. Features of the present invention may thus capitalize on timing mechanism inherent to existing emulation hardware used to transfer data between different chips within the emulator 16.

In contrast to the prior art, embodiments call for software executed at a processor 30 of the RTAU 14 to be managed such that the time between instructions may be similarly predicted, allowing a fixed time relationship. Within the processor realm, this may be achieved by coding at the processor instruction level (i.e., assembler), while disabling interrupts during the portion of the code that is to interface with the emulator 16. Additionally, the time to implement a load or store instruction to the addresses assigned to the emulator I/O ports may also be fixed during the design of the RTAU 14. Thus, the processor 30 may also exhibit fixed, known, predictable time between load and store GPR instructions.

Since the emulator 16 may have predictable internal times, and the processor 30 of the RTAU 14 may also have predictable internal times, if the two may be precisely synchronized, they may be programmed to exchange time multiplexed data with one another over the same connection, i.e., wires and ports. Also, staging registers of the prior art may be eliminated.

In the past, a DSTEP signal was used to initiate sending data from both the RTAU and the emulator. However, the skew/timing between the two paths was not relatively well controlled. For instance, DSTEP would generally arrive at the RTAU 14 several nanoseconds before it hit the emulator 16. An aspect of the present invention precisely tunes DSTEP between the RTAU 14 and the emulator 16. To this end, the system 10 may use programmable delays 42, 56 and external measurement to calibrate the system 10 once it is plugged together. These features remove the skews from the DSTEP signals, allowing different times of flight over cables between the two pieces.

Thus, combining features that include: fixed delay software and known latency on instructions within the processor 30; fixed delay between the execution of I/O operations within the internal emulation sequence; the ability to precisely control the start of both the processor 30 and emulator 16 using calibration and programmable delay techniques; and, precise measurements on the physical connection 15 between processor/RTAU and emulator 16 allows a predictable timing between I/O instructions inside the emulator 16 and I/O instructions inside the processor 14 to be coordinated such that the same physical connection 15 may be used to transmit and receive multiple signals within a single cycle of model evaluation. Because data may go directly into and out of the processor GPR's 44, no additional latency penalty is introduced by conventional staging or re-powering registers. This ability allows the design of the processor controlled RTAU 14 to be simplified, translating into dramatically reduced costs, while still maintaining overall system performance.

The system 10 also includes a host workstation 12 comprising any suitable type of computer that has the capability of executing or running hardware design simulation and emulation programs of the type known in the art. A user operates workstation 12 to control the emulation using a suitable control program. Under control of the program, workstation 12 may provide input data to the emulation, receive the output data (results) of the emulation, and display the output in a manner that is meaningful to the user, such as in the form of timing diagrams on a graphical display (not shown). A networked control card 45 coupled to the emulator 16 provides the interface with workstation 12 and performs other functions, such as propagating certain signals between emulator 16 and a master panel of the workstation 12.

Although not illustrated for purposes of clarity, the system may include more than one workstation 12 so that multiple users can run their emulations in parallel to some extent. In such an environment, one of the workstations can be designated as a main host that manages the various users, and controls the assignment of emulator 16 and associated RTAU's 14 to the various users' emulations and release of emulator(s) 16, as well as their associated RTAU's 14 from their emulations when completed. For purposes of clarity, the description in this patent specification pertains to the instance in which a single user is performing a single emulation, and the structures and functions are described from that perspective.

Emulator 16 is described in U.S. Pat. No. 5,946,472 and is preferably of the type produced by IBM Corporation under the name "ETX" (versions have included ET3.0, ET3.5, etc.). The ETX logic is primarily embodied in a single chip, but emulator 16 may be implemented in any suitable combination of chip-level hardware and board-level hardware. In the above-referenced patent, an improvement was described wherein the ETX processed the concurrent operations in an emulation, and a behavior card processed the sequential operations. In accordance with the present invention, RTAU's 14 may be such behavior cards, but they may alternatively be other types of devices.

Emulator 16 further communicates information with step generator 18. Step generator 18 may generally function to send the DSTEP signal to both the RTAU 14 and the emulator 16 at the beginning of a new cycle. To this end, the step generator 18 may receive prior to sending the DSTEP confirmation signals from both the RTAU 14 and the emulator 16 verifying that they have respectively completed the previous cycle.

The exemplary RTAU 14 includes a processor 30 and an associated memory 32 for holding program/model instructions and data 34, which may include multiplexing instructions and data. The model instructions and/or data 34 may be used to model a portion of the hardware design, such as a memory. RTAU 14 further includes a network interface 36 for communicating with workstation 12. Although unnecessary in certain applications, such direct communication between RTAU 14 and workstation 12 may be beneficial under some circumstances.

GPR's 44 are also included in the RTAU 14. The GPR's include registers having data that is directly used, adjusted or otherwise accessed by a processor 30, as opposed to conventional staging registers. These GPR's 44 additionally may directly receive emulation data from the emulator 16. This feature mitigates conventional delay associated with latching and retrieving data from buffers or external registers. Less delay translates into quicker processing of instructions.

A programmable delay 42 of the RTAU 14 may be used to synchronize the initial processing of emulation data. The delay from step generator 18 to the emulator 16 may be different than to RTAU 14 due to different cable lengths. To accommodate this, the delay 42 may be tuned using an oscilloscope or other measuring device to account for any latency and transmission delays. As such, the RTAU may begin processing emulator data concurrently with the emulator's own processing emulator data for a given cycle. To this end, the delay 42 may receive the DSTEP and/or otherwise communicate with the step generator 18. These features help diminish conventional latency affects, and may allow code executed by the processor to be effectively coordinated with emulator cycles.

The exemplary emulator 16 of FIG. 1 may include a programmable delay 56 for coordinating initial and concurrent data execution. The emulator 16 may likewise include the logical equivalent of registers 46, a processor 48, a memory 50, as well as model instructions and data 52. Data interface 38 may communicate with additional target hardware 24.

The connection 15 that connects the RTAU 14 and the emulator 16 may comprise one more wires, typically bundled in a cable. Of note, the emulating data communicated over the connection 15 from the RTAU 14 and/or the emulator 16 may be time division multiplexed. That is, different data bits may be allocated different time slots in a communication stream, allowing multiple data values to arrive over a single wire, or common connection 15. Such time multiplexed communications may flow simultaneously in a first direction from the emulator 16 to the RTAU 14 and/or in a second direction from the RTAU 14 to the emulator 16. As discussed herein, this time multiplexing is possible, in part, due to precise starting points for an emulation cycle, knowledge of how long the RTAU code takes to execute in the absence of interrupts, as well as knowledge of how long data takes to travel over the connection 15, among other factors.

In one scenario, the emulator 16 may send data segments comprising the four registers worth of data to the RTAU 14. The emulator may consequently send the four registers worth of data at intervals beginning at 50, 80, 110 and 140 nanoseconds. The data is sent over a single wire connection 15. For exemplary purposes, each data segment takes 50 nanoseconds to travel the distance of the connection 15 and to arrive in a GPR 44. In part because the processor 30 of the RTAU 14 has been initiated/synchronized with the emulator 16 according to a common clock, and further because the delay 42 has been tuned according to the specific hardware processing times, the processor 30 consequently knows that the data segments will arrive respectively at intervals of 100, 130, 160 and 190 nanoseconds. The processor 30 may thus directly read into separate GPR's the time multiplexed data segments from the cable/emulator interface at the predetermined times. One skilled in the art will appreciate concurrent communications between the emulator and the RTAU may be ongoing, e.g., while the emulator is sending four segments, the RTAU may be sending two segments back.

Those skilled in the art will further recognize that the exemplary environment 10 illustrated in FIG. 1 is not intended to limit the present invention. For instance, various types of RTAU's may alternatively and/or additionally be included. The behavior card described in U.S. Pat. No. 5,946,472 is an example of one type of RTAU. It includes a processor on which a user model program executes. Another type of RTAU is a network-based direct attach stimulus (NDAS) card, which moves data directly between the emulator and the workstation. Of note, while NDAS cards do involve multiplexing, the multiplexed signal is conventionally delivered to staging registers, not GPR's. Direct delivery to the GPR's allows embodiments consistent with the present invention to minimize latency that would otherwise result from having to transfer data from staging registers to the GPR's.

Moreover, it should be noted that the term emulator as used to describe the present invention can refer to a hardware emulator, a simulation accelerator, an emulator used as a simulation accelerator, or a simulation accelerator used as an emulator. Indeed, those skilled in the art will recognize that other alternative hardware and/or software environments may be used without departing from the scope of the invention. For instance, one skilled in the art will appreciate that underlying principles of the present invention may be incorporated one or more logic circuit arrangements, typically implemented on one or more integrated circuit devices, and optionally including additional discrete components interfaced therewith.

It should also be recognized that circuit arrangements are typically designed and fabricated at least in part using one or more computer data files, referred to herein as hardware definition programs, that define the layout of the circuit arrangements on integrated circuit devices. The programs are typically generated in a known manner by a design tool and are subsequently used during emulation. Typically, the programs are provided in a predefined format using a hardware definition language. Thus, while the invention has and hereinafter will be described in the context of circuit arrangements implemented in fully functioning integrated circuit devices, those skilled in the art will appreciate that circuit arrangements consistent with the invention are capable of being distributed as program products in a variety of forms, and that the invention applies equally regardless of the particular type of computer readable signal bearing media used to actually carry out the distribution. Examples of computer readable signal bearing media include but are not limited to recordable type media such as volatile and non-volatile memory devices, floppy disks, hard disk drives, CD-ROM's, and DVD's, among others, and transmission type media such as digital and analog communications links.

FIG. 2 shows an exemplary processing and timing sequence 60 regarding the emulator 16 of FIG. 1. The sequence 60 more particularly charts emulator processing activity 61 over a period of time, i.e., about 200 nanoseconds. The sequence 60 tracks the emulator activity according to the example communication given in the text describing FIG. 1. Namely, the emulator 16 sends data at 30 nanosecond intervals beginning at 50, 80, 110 and 140 nanoseconds. These times 62-68 coincide with clock pulses, or cycles. Each interval/segment 62-64, 64-66, 66-68 may coincide with internal emulator clock pulses or cycles. FIG. 3 shows an exemplary processing and timing sequence 80 for the RTAU 14 of FIG. 1. More particularly, the RTAU 14 receives the data sent by the emulator in FIG. 2 after a 50 nanosecond delay. The data is consequently received at intervals beginning at 100, 130, 160 and 190 nanoseconds. The processor 30 may thus directly read into separate GPR's the time multiplexed data segments at times 100, 130, 160 and 190 nanoseconds from the cable/emulator interface. This example of time multiplexing reduces hardware and processing requirements.

While the present invention has been illustrated by a description of various embodiments and while these embodiments have been described in considerable detail, it is not the intention of the applicants to restrict, or in any way limit, the scope of the appended claims to such detail. As such, additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A method for emulating a hardware design in a system of a type that is configured to communicate emulation data over a connection, and that includes an emulator and a runtime assist unit having a general purpose register directly accessible by a processor of the runtime assist unit, the method comprising:
   determining a time associated with at least one of: storing emulation data, loading emulation data and sending emulation data, including sending emulation data over the connection;
   time division multiplexing the emulation data, wherein the determined time is used to time division multiplex the emulation data;
   disabling an external interrupt of the runtime assist unit;
   in response to disabling the external interrupt of the runtime assist unit, providing a virtual I/O between the runtime assist unit and the emulator such that the time division multiplexed emulation data may be received by the runtime assist unit at any time;
   in response to providing the virtual I/O between the runtime assist unit and the emulator, communicating over the connection the time division multiplexed emulation data between the emulator and the general purpose register of the runtime assist unit, the time division multiplexed emulation data received by the runtime assist unit being received directly by the general purpose register of the runtime assist unit; and
   emulating the hardware design using the communicated data.

2. The method of claim 1, wherein communicating the time division multiplexed emulation data between the emulator and the general purpose register of the runtime assist unit includes communicating at least a portion of the time division multiplexed emulation data from the emulator to the runtime assist unit.

3. The method of claim 1, wherein communicating the time division multiplexed emulation data between the emulator and the general purpose register of the runtime assist unit includes communicating at least a portion of the time division multiplexed emulation data from the runtime assist unit to the emulator.

4. The method of claim 1, further comprising delaying processing of the time division multiplexed emulation data by at least one of the emulator and the runtime assist unit.

5. The method of claim 1, further comprising coding software configured to be executed by the processor of the runtime assist unit using language having predictable execution relative to time.

6. The method of claim 1, further comprising sending a signal configured to initiate a cycle to at least one of the emulator and the runtime assist unit.

7. The method of claim 1, further comprising synchronizing respective cycle start times for the runtime assist unit and the emulator.

* * * * *